(12) United States Patent
Liu et al.

(10) Patent No.: US 11,644,485 B2
(45) Date of Patent: May 9, 2023

(54) CURRENT SENSOR INTEGRATED CIRCUITS

(71) Applicant: Allegro MicroSystems, LLC, Manchester, NH (US)

(72) Inventors: Shixi Louis Liu, Hooksett, NH (US); Paul A. David, Bow, NH (US); Natasha Healey, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 63 days.

(21) Appl. No.: 17/495,879

(22) Filed: Oct. 7, 2021

(65) Prior Publication Data
US 2023/0110671 A1   Apr. 13, 2023

(51) Int. Cl.
*G01R 15/20* (2006.01)
*H01L 23/49* (2006.01)
(Continued)

(52) U.S. Cl.
CPC ....... *G01R 19/0092* (2013.01); *G01R 15/207* (2013.01); *H01L 23/49541* (2013.01);
(Continued)

(58) Field of Classification Search
CPC .............. G01R 19/0092; G01R 15/207; H01L 23/49541; H01L 23/49575; H01L 2224/49171
See application file for complete search history.

(56) References Cited

U.S. PATENT DOCUMENTS

| 4,893,073 A | 1/1990 | McDonald et al. |
| 5,041,780 A | 8/1991 | Rippel |

(Continued)

FOREIGN PATENT DOCUMENTS

| DE | 41 41 386 A1 | 6/1993 |
| DE | 10 2008 034 577 A1 | 2/2010 |

(Continued)

OTHER PUBLICATIONS

3M Electrical Markets Product Brochure "Electrical, Electronic and EMI, Shielding Tapes Selection Guide", 2007, 12 pages.
(Continued)

*Primary Examiner* — Jermele M Hollington
*Assistant Examiner* — Zannatul Ferdous
(74) *Attorney, Agent, or Firm* — Daly, Crowley, Mofford & Durkee, LLP

(57) ABSTRACT

A current sensor integrated circuit configured to sense a current through a current conductor includes a lead frame at least one signal lead, a fan out wafer level package (FOWLP), and a mold material enclosing the FOWLP and a portion of the lead frame. The FOWLP includes a semiconductor die configured to support at least one magnetic field sensing element to sense a magnetic field associated with the current, wherein the semiconductor die has a first surface on which at least one connection pad is accessible, a redistribution layer in contact with the at least one connection pad, and an insulating layer in contact with the redistribution layer, wherein the insulating layer is configured to extend beyond a periphery of the semiconductor die by a minimum distance. The die connection pad is configured to be electrically coupled to the at least one signal lead.

17 Claims, 13 Drawing Sheets

(51) Int. Cl.
  *G01R 19/00* (2006.01)
  *H01L 23/495* (2006.01)
(52) U.S. Cl.
  CPC .................. *H01L 23/49575* (2013.01); *H01L 2224/49171* (2013.01)

(56) References Cited

U.S. PATENT DOCUMENTS

| | | | |
|---|---|---|---|
| 5,124,642 | A | 6/1992 | Marx |
| 5,247,202 | A | 9/1993 | Popovic et al. |
| 5,615,075 | A | 3/1997 | Kim |
| 6,005,383 | A | 12/1999 | Savary et al. |
| 6,252,389 | B1 | 6/2001 | Baba et al. |
| 6,356,068 | B1 | 3/2002 | Steiner et al. |
| 6,462,531 | B1 | 10/2002 | Ohtsuka |
| 6,545,456 | B1 | 4/2003 | Radosevich et al. |
| 6,683,448 | B1 | 1/2004 | Ohtsuka |
| 6,727,683 | B2 | 4/2004 | Goto et al. |
| 6,995,315 | B2 | 2/2006 | Sharma et al. |
| 7,025,287 | B2 | 7/2006 | Mangtani et al. |
| 7,166,807 | B2 | 1/2007 | Gagnon et al. |
| 7,358,724 | B2 | 4/2008 | Taylor et al. |
| 7,598,601 | B2 | 10/2009 | Taylor et al. |
| 7,709,754 | B2 | 5/2010 | Doogue et al. |
| 7,768,083 | B2 | 8/2010 | Doogue et al. |
| 8,907,437 | B2 | 12/2014 | Milano et al. |
| 10,718,794 | B2 | 7/2020 | El Bacha et al. |
| 2004/0056647 | A1 | 3/2004 | Stauth et al. |
| 2004/0080308 | A1 | 4/2004 | Goto |
| 2004/0113280 | A1 | 6/2004 | Kim |
| 2004/0155644 | A1 | 8/2004 | Stauth et al. |
| 2006/0002147 | A1 | 1/2006 | Hong et al. |
| 2006/0219436 | A1 | 10/2006 | Taylor et al. |
| 2009/0206833 | A1 | 8/2009 | Imai et al. |
| 2010/0156394 | A1 | 6/2010 | Ausserlechner et al. |
| 2011/0221429 | A1 | 9/2011 | Tamura |
| 2011/0316149 | A1 | 12/2011 | Suzuki et al. |
| 2013/0020660 | A1* | 1/2013 | Milano ................ G01R 15/207 257/E27.005 |
| 2019/0285667 | A1 | 9/2019 | Milano et al. |
| 2019/0311976 | A1* | 10/2019 | Salamone ......... H01L 23/49531 |
| 2020/0211938 | A1* | 7/2020 | Park ................... H01L 23/3735 |
| 2020/0328168 | A1* | 10/2020 | Roh ........................ H01L 24/05 |
| 2021/0116810 | A1* | 4/2021 | Hashimoto ............. H01L 24/19 |
| 2021/0376227 | A1 | 12/2021 | Latham |

FOREIGN PATENT DOCUMENTS

| | | |
|---|---|---|
| EP | 1 107 327 A2 | 6/2001 |
| EP | 1 107 328 A2 | 6/2001 |
| EP | 1 111 693 A2 | 6/2001 |
| JP | S 61-71649 | 4/1986 |
| JP | H 4-364472 | 12/1992 |
| JP | H 08-211138 | 8/1996 |
| JP | 2001-174486 | 6/2001 |
| JP | 2003-130895 | 5/2003 |
| JP | 2003-172750 | 6/2003 |
| JP | 2003-329749 | 11/2003 |
| JP | 2011-017713 | 1/2011 |
| JP | 2011-069837 | 4/2011 |
| WO | WO 99/14605 | 3/1999 |

OTHER PUBLICATIONS

Allegro Datasheet ACS712, Fully Integrated, Hall Effect-Based Linear Current Sensor IC with 2.1 kVRMS Isolation and a Low-Resistance Current Conductor, 2006-2010, 14, pages.
Allegro Datasheet ACS758xCB, Thermally Enhanced, Fully Integrated, Hall Effect-Based Linear Current Sensor IC with 100 µՈ Current Conductor, 2008-2010, 19 pages.
Steiner, et al., "Fully Packaged CMOS Current Monitor Using Lead-on-Chip Technology," Physical Electronics Laboraotry, ETH Zurich, CH8093 Zurich, Switzerland, 0-7803-4412-X98; IEEE 1998; 6 pages.
Underwriters Laboratories Inc. (UL), UL Standard for Safety for Information Technology Equipment—Safety; General Requirements, UL 60950-1, Second Edition, dated Mar. 27, 2007, 510 pages.
U.S. Appl. No. 11/144,970, filed Jun. 3, 2005 U.S. Pat. No. 7,166,807, issued Jan. 23, 2007.
PCT Search Report and Written Opinion of the ISA for PCT/US2004/009908 dated Aug. 16, 2004, 15 pages.
Extended EP Search Report dated Dec. 7, 2011 for EP Application No. 09000122.3, filed Jan. 8, 2009, 6 pages.
Office Action dated Aug. 23, 2012 for EP Application No. 09000122.3, filed Jan. 8, 2009, 4 pages.
Response to Office Action filed Dec. 18, 2012 for EP Application No. 09000122.3, filed Jan. 8, 2009, 39 pages.
EP Intention Grant dated Sep. 30, 2013 for EP Application No. 09000122.3, filed Jan. 8, 2009, 7 pages.
Letter from JP Associate translating Office Action dated Jun. 21, 2011 for JP Application No. 2010-281774, filed Dec. 17, 2010, 2 pages.
Letter to JP Associate dated Jul. 6, 2011, re filing response, for JP Application No. 2010-281774, filed Dec. 17, 2010, 3 pages.
Letter from FA with Response dated Aug. 18, 2011, for JP Application No. 2010-281774, filed Dec. 17, 2010, 5 pages.
Translation of Office Action dated Feb. 6, 2012, for JP Application No. 2010-281774, filed Dec. 17, 2010, 2 pages.
Letter to JP Associate dated Feb. 16, 2012 re filing response, for JP Application No. 2010-281774, filed Dec. 17, 2010, 3 pages.
Translation of Office Action dated Sep. 20, 2012, for JP Application No. 2010-281774, filed Dec. 17, 2010, 2 pages.
Letter from JP Associate with Response dated Dec. 20, 2012, for JP Application No. 2010-281774, filed Dec. 17, 2010, 9 pages.
Notice of Allowance dated Apr. 26, 2013, for JP Application No. 2010-281774, filed Dec. 17, 2010, 5 pages.
Preliminary Amendment dated Feb. 21, 2012 for U.S. Appl. No. 13/188,739; 73 pages.
Restriction Requirement dated Jun. 27, 2013 for U.S. Appl. No. 13/188,739; 7 pages.
Response to Restriction Requirement dated Jun. 28, 2013 for U.S. Appl. No. 13/188,739; 1 page.
Office Action dated Aug. 16, 2013 for U.S. Appl. No. 13/188,739; 15 pages.
Amendment dated Oct. 23, 2013 for U.S. Appl. No. 13/188,739; 11 pages.
Final Office Action dated Jan. 10, 2014 for U.S. Appl. No. 13/188,739; 15 pages.
Amendment dated Apr. 11, 2014 for U.S. Appl. No. 13/188,739; 10 pages.
Notice of Allowance dated Oct. 3, 2014 for U.S. Appl. No. 13/188,739; 7 pages.
International Search Report and Written Opinion dated Nov. 27, 2012 for PCT Application No. PCT/US2012/046025, 11 pages.
Notification Transmittal of International Preliminary Report on Patentability dated Feb. 6, 2014 for PCT Application No. PCT/US2012/046025, 8 pages.
Japanese Office Action dated Oct. 23, 2015 with English translation for Japanese Application No. 2014-521652; 10 pages.
Response to Japanese Office Action filed on Jan. 8, 2016 with English translation for Japanese Application No. 2014-521652; 8 pages.
Japanese Office Action dated Jun. 30, 2016 with English translation for Japanese Application No. 2014-521652; 5 pages.
German Office Action with English Translation dated Dec. 1, 2017 for German Application No. 112012003079.6, 18 pages.
Response (with English Translation) to German Office Action dated Dec. 1, 2017 for German Application No. 112012003079.6; Response filed on Apr. 6, 2018; 116 pages.
Japanese Office Action with English translation dated Sep. 15, 2017 for Japanese Application No. 2016-209261; 19 pages.
Japanese Response to Office Action with English translation dated Dec. 14, 2017 for Japanese Application No. 2016-209261; 22 pages.

(56) References Cited

OTHER PUBLICATIONS

Japanese Office Action with English translation dated May 9, 2018 for Japanese Application No. 2016-209261; 9 pages.
Japanese Response to Office Action with English translation dated Aug. 3, 2018 for Japanese Application No. 2016-209261; 11 pages.
Japanese Office Action with English translation dated Oct. 3, 2018 for Japanese Application No. 2016-209261; 4 pages.
Japanese Response to Office Action with English translation dated Oct. 18, 2018 for Japanese Application No. 2016-209261; 11 pages.
Japanese Notice of Allowance with English translation dated Oct. 30, 2018 for Japanese Application No. 2016-209261; 5 pages.

* cited by examiner

CURRENT SENSOR INTEGRATED CIRCUITS

FIELD

This invention relates generally to current sensor integrated circuits and more particularly to current sensor integrated circuits with electrical isolation structures and techniques.

BACKGROUND

Some electrical current sensors use one or more magnetic field sensing elements in proximity to a current-carrying conductor. The magnetic field sensing elements generate an output signal having a magnitude proportional to the magnetic field induced by the current through the conductor.

In applications in which the conductor can be at a relatively high voltage, safety specifications require that a certain electrical isolation be maintained between the conductor and other parts of the circuitry (e.g., signal leads coupled to an external system on which the sensor output signal is communicated). The term "creepage" refers to the shortest distance between two conductive parts along the surface of any insulation material common to two conductive parts. The creepage requirement is based on the distance necessary to withstand a given working voltage (i.e., the highest voltage level that insulation under consideration can be subjected to when the current sensor is operating in normal use).

Some current sensor integrated circuits achieve the required electrical isolation using an insulating tape, such as one or more layers of polyimide film. One such current sensor is described in U.S. Pat. No. 8,907,437 entitled "Reinforced Isolation for Current Sensor with Magnetic Field Transducer" that is assigned to the Assignee of the subject disclosure and that issued on Dec. 9, 2014.

SUMMARY

Described herein are structures and manufacturing methods directed towards providing current sensor integrated circuits (ICs) that meet electrical isolation requirements for high voltage applications. The described current sensor IC includes a fan out wafer level package (FOWLP). Use of the FOWLP facilitates fabrication and reduces manufacturing costs while meeting electrical isolation requirements.

According to the disclosure, a current sensor integrated circuit configured to sense a current through a current conductor includes a lead frame comprising at least one signal lead, a fan out wafer level package (FOWLP), and a mold material enclosing the FOWLP and a portion of the lead frame. The FOWLP includes a semiconductor die configured to support at least one magnetic field sensing element to sense a magnetic field associated with the current, wherein the semiconductor die has a first surface from which at least one connection pad is accessible, and wherein the at least one connection pad is configured to be electrically coupled to the at least one signal lead. The FOWLP further includes a redistribution layer in contact with the at least one connection pad, and an insulating layer in contact with the redistribution layer, wherein the insulating layer is configured to extend beyond a periphery of the semiconductor die by a minimum distance.

Features may include one or more of the following individually or in combination with other features. The redistribution layer can include a conductive trace and at least one solder bump, wherein the conductive trace is electrically coupled between the at least one connection pad of the semiconductor die and the at least one solder bump. The at least one solder bump can be configured to be electrically connected to the at least one signal lead of the lead frame in a flip-chip configuration. The at least one solder bump of the redistribution layer can include two insulating layers and two metal layers. The minimum distance can be based on electrical isolation breakdown requirements. In some embodiments, the minimum distance is on the order of 200 microns. The insulating layer can include polyimide. The conductive trace can extend beyond the periphery of the semiconductor die and the at least one solder bump can be positioned beyond the periphery of the semiconductor die. The at least one solder bump of the redistribution layer can include at least one first solder bump configured to electrically connect the semiconductor die to the at least one signal lead and at least one second solder bump that is not electrically connected to the semiconductor die and that is configured to be attached to the current conductor. A dimension of the semiconductor die can be selected independently of a dimension of the lead frame. The lead frame can further include at least two leads coupled together to form the current conductor. Alternatively, the current conductor can be external with respect to the current sensor integrated circuit. For example, the current conductor can be part of a printed circuit board.

Also described is a method of manufacturing a current sensor integrated circuit to sense a current through a current conductor including providing a lead frame comprising at least one signal lead and providing a fan out wafer level package (FOWLP) including a semiconductor die configured to support at least one magnetic field sensing element to sense a magnetic field associated with the current and configured to be electrically coupled to the at least one signal lead, a redistribution layer in contact with the semiconductor die and comprising at least one solder bump, and an insulating layer in contact with the redistribution layer and extending beyond a periphery of the semiconductor die by a minimum distance. The method further includes assembling the current sensor integrated circuit by soldering the at least one solder bump to the at least one signal lead of the lead frame.

Features may include one or more of the following individually or in combination with other features. Providing the FOWLP can include dicing a wafer into a plurality of semiconductor die, each semiconductor die having a first surface from which a connection pad is accessible and a second, opposing surface, applying the plurality of semiconductor die to a carrier with the second surface of each of the plurality of semiconductor die adjacent to the carrier, wherein the plurality of semiconductor die are spaced apart on the carrier, encapsulating the plurality of semiconductor die with an encapsulation material in contact with the first surface of each of the plurality of semiconductor die, applying a support wafer to the encapsulation material, removing the carrier, providing the redistribution layer on the first surface of each of the plurality of semiconductor die, applying the insulating layer on the first surface of each of the plurality of semiconductor die, removing the support wafer, and dicing the plurality of semiconductor die to form the FOWLP. Providing the redistribution layer can include applying a conductive trace to the first surface of the semiconductor die of the FOWLP between the connection pad and the at least one solder bump and wherein the at least one solder bump is positioned beyond the periphery of the semiconductor die. Providing the at least one solder bump of the redistribution layer can include applying two insulating layers and two metal layers to form the at least one solder bump. Applying the insulating layer can include applying a polyimide layer. Providing the redistribution layer can include providing at least one first solder bump configured to electrically connect the semiconductor die to the at least one signal lead and at least one second solder bump that is not electrically connected to the semiconductor die, and assembling the current sensor integrated circuit can further include soldering the at least one second solder bump to the current conductor. Providing the lead frame can include coupling together at least two leads of the lead frame to form the current conductor.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
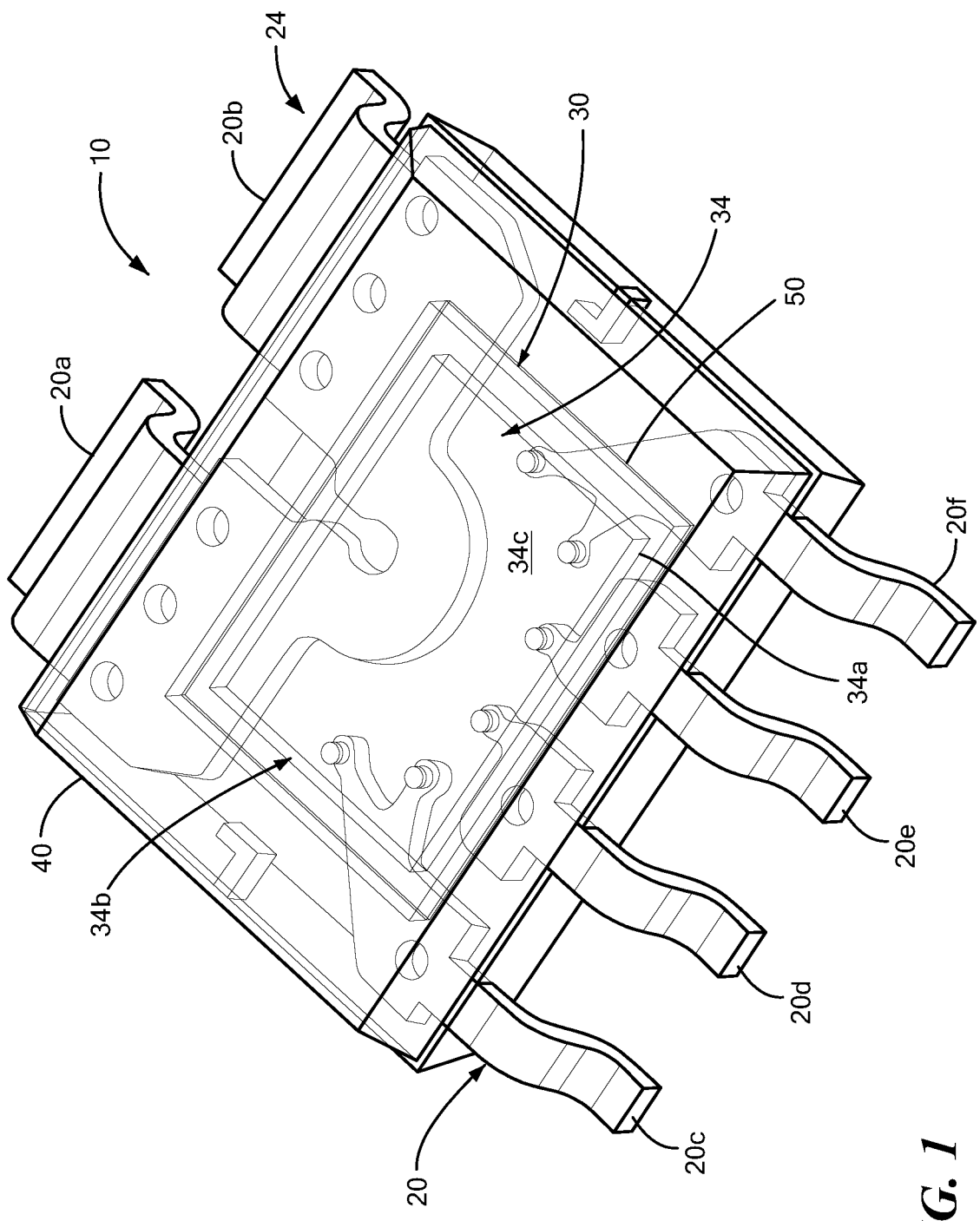
FIG. 1 is an isometric view of a current sensor IC according to the disclosure.
Figure 2:
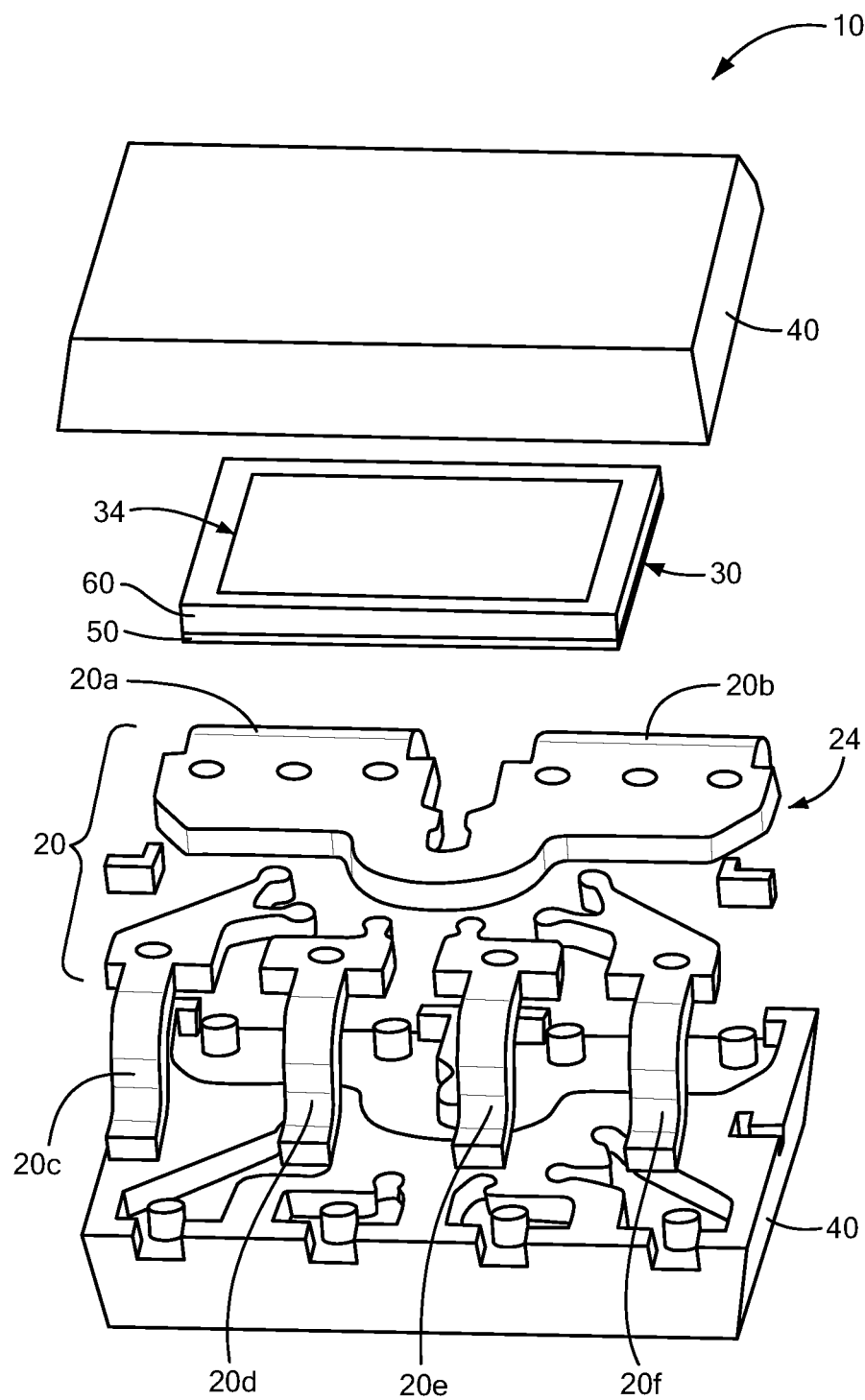
FIG. 2 is an exploded view of the current sensor IC of FIG. 1.

Referring to FIGS. 1 and 2, a current sensor integrated circuit 10 configured to sense a current through a current conductor 24 includes a lead frame 20, a fan out wafer level package (FOWLP) 30, and a mold material 40 enclosing the FOWLP and a portion of the lead frame. The lead frame 20 includes at least one (and here four) signal leads 20c-20f. The FOWLP 30 includes a semiconductor die 34, a redistribution layer 44 (FIG. 5), and an insulating layer 50. The semiconductor die 34 is configured to support at least one magnetic field sensing element 36 (FIG. 5) to sense a magnetic field associated with the current and has a first surface 34a on which at least one connection pad 38 (FIG. 5) is accessible and a second, opposite surface 34c. The connection pad 38, as can be referred to alternatively as a bond pad, is electrically coupled to circuitry supported by the die 34 and is configured to be electrically coupled to at least one signal lead 20c-20f. The redistribution layer 44 is in contact with the at least one connection pad 38. The insulating layer 50 is in contact with the redistribution layer 44 and extends beyond a periphery, or perimeter 34b of the semiconductor die 34 by at least a minimum distance "d" (FIG. 5).

With this arrangement, the FOWLP 30 is positioned and dimensioned to provide electrical isolation sufficient to meet a specified creepage requirement of a current sensing application. Further use of the FOWLP 30 facilitates manufacture of the current sensor IC 10 since the process for FOWLP fabrication is readily available.

Figure 3:
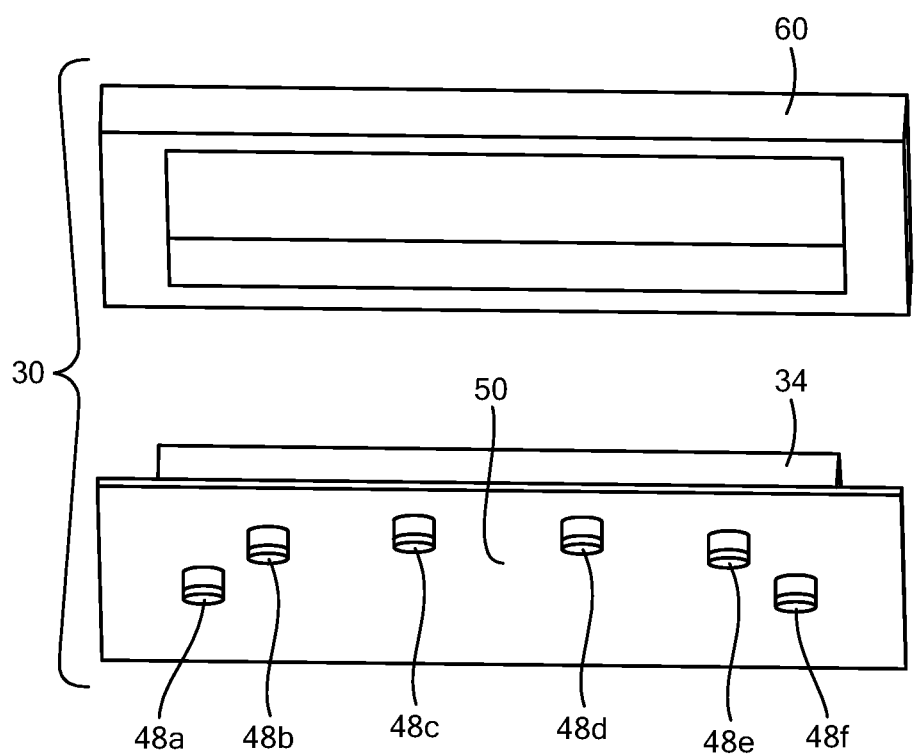
FIG. 3 is an exploded view of a portion of the current sensor IC of FIG. 1.
Figure 4:
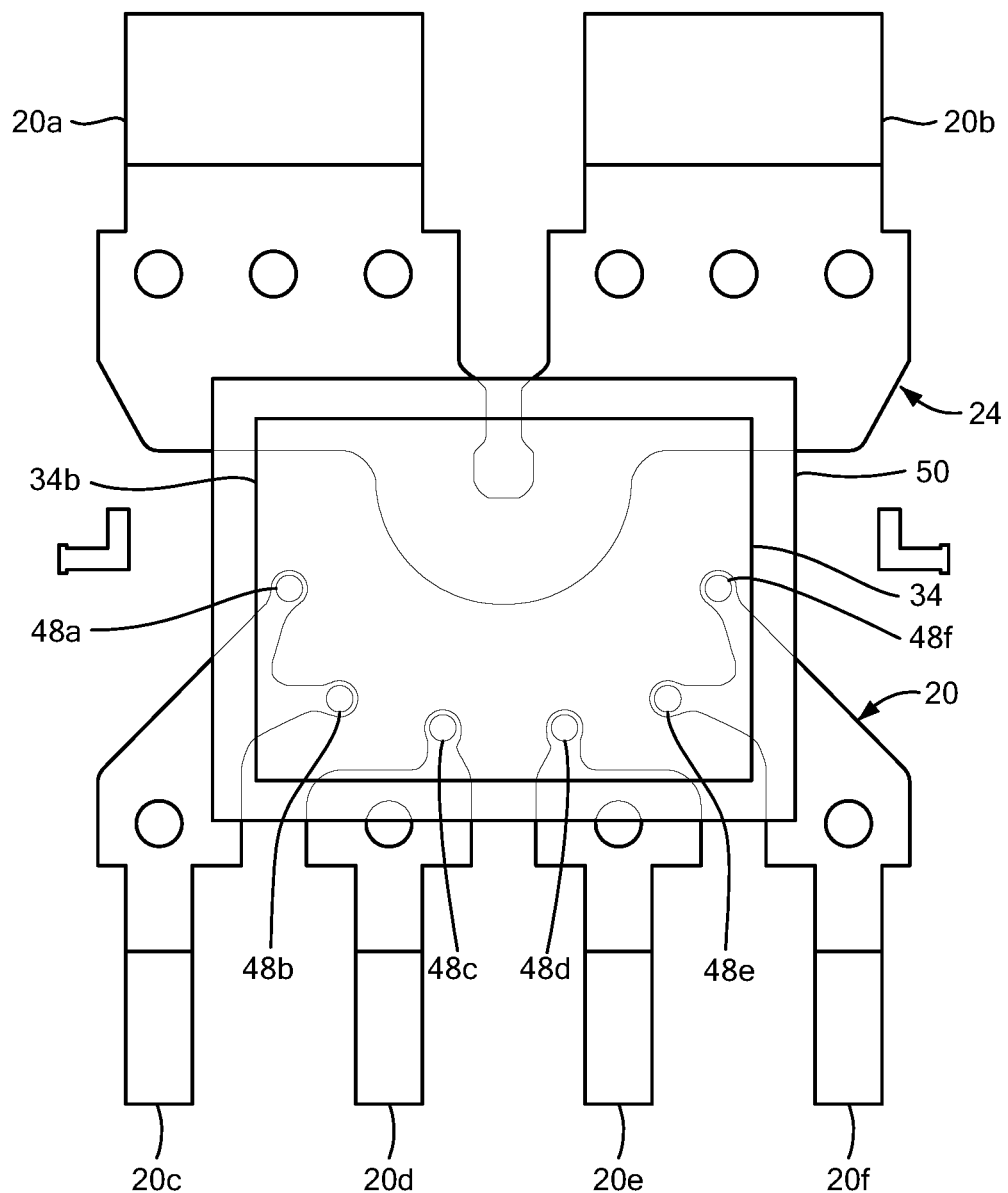
FIG. 4 is a plan view of a portion of the current sensor IC of FIG. 1.
Figure 5:
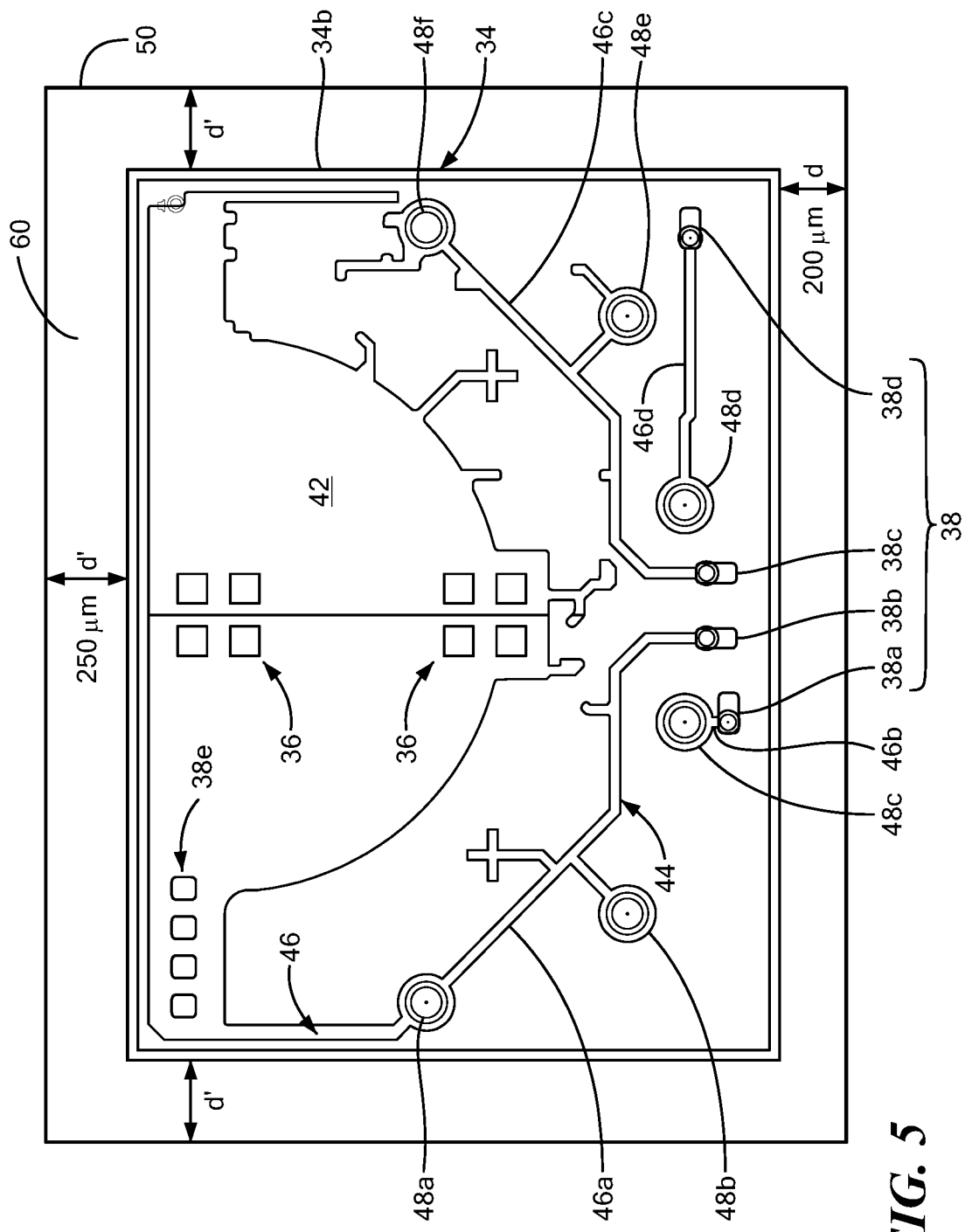
FIG. 5 is a plan view of a portion of the current sensor IC of FIG. 1.

While the current sensor views of FIGS. 1 and 2 include the entire sensor IC 10 (albeit with FIG. 2 shown in exploded fashion), FIGS. 3, 4, and 5 show additional detail of portions of the current sensor. Specifically, FIG. 3 shows an exploded view of the FOWLP 30, FIG. 4 shows a top outline view of the lead frame and FOWLP 30, and FIG. 5 shows a top outline view of the FOWLP 30 and includes details of the semiconductor die 34 and redistribution layer 44.

The lead frame 20 can include at least two leads 20a, 20b coupled together to form the current conductor 24. In other embodiments, the current conductor can be external with respect to the current sensor IC. For example, the current conductor can be part of a printed circuit board, as is shown in connection with the current sensor IC embodiment of FIG. 11.

Leads 20a-20f of the lead frame extend from the mold material 40 in order to permit electrical connection to external circuits and systems (not shown). Various arrangements are possible for connecting the leads 20a-20f to external components and systems. The example sensor IC 10 is configured for surface mount attachment to a printed circuit board or other suitable substrate and so, the terminal ends of leads 20a-20f can be formed and plated for surface mount attachment. It will be appreciated by those of skill in the art that the terminal ends of leads 20a-20f can, alternatively be provided for other types of attachment techniques, such as through hole attachment for example.

As can be seen in FIG. 5, the redistribution layer 44 includes one or more conductive traces 46 and one or more solder bumps 48. Here, the redistribution layer 44 includes six solder bumps 48a-48f (herein collectively solder bumps 48) and the semiconductor die 34 includes four connection pads 38a-38d (herein collectively connection pads 38). Connection pads 38a-38d permit electrical connection to be made to magnetic field sensing elements 36 and other elements and circuitry supported by the die 34. As will be explained, die connection pads 38 can be connected to external circuits and systems by being electrically coupled through the FOWLP 30 to lead frame leads 20c-20f in a flip-chip configuration.

Example connection pads 38 include pad 38a that provides a connection through which features of the IC 10 can be programmed, pad 38b though which a ground connection can be made, pad 38c that provides a power connection to the IC, and pad 38d through which a sensor output signal can be accessed. Additional connection pads 38e can provide test point access to the die 34.

Conductive traces 46 are configured to electrically couple the semiconductor die connection pads 38 to respective solder bumps 48. For example, a first conductive trace 46a electrically couples connection pad 38b and solder bumps 48a and 48b, a second conductive trace 46b electrically couples connection pad 38a and solder bump 48c, a third conductive trace 46c electrically couples connection pad 38c and solder bumps 48e and 48f, and a fourth conductive trace 46d electrically couples connection pad 38d to solder bump 48d. It will thus be appreciated that there need not be a one-for-one relationship between die connection pads 38 and solder bumps 48. For example, a single connection pad 38 can be electrically coupled to more than one solder bump (e.g., as is the case for connection pad 38b and connection pad 38c). The number of solder bumps 48 and their electrical connection to die connection pads 38 can be based on the desired pinout of the IC package 10.

The redistribution layer 44 can be comprised of any suitable conductive material such as copper and can be formed on the surface 34a of the semiconductor die 34 in contact with the die connection pads 38. The shape and dimensions of the redistribution layer 44 can be tailored to achieve the desired electrical connection between connection pads 38 and solder bumps 48. For example, redistribution layer 44 can include narrow, elongated traces 46. Additional features of the redistribution layer 44 can include a shielding portion 42 configured to reduce the effects of electrical, voltage, or electrical transient noise coupled to active circuitry within the current sensor 10 through parasitic capacitance between the current conductor 24 and circuitry supported by the semiconductor die 34. The shield portion 42 can be coupled to a reference potential, such as ground.

In assembly, solder bumps 48a-48f are configured to be aligned with signal leads 20c-20f of the lead frame 20 in a flip-chip configuration and soldered to the signal leads in order to achieve an electrical connection between the signal leads and the semiconductor die 34. The solder bumps 48 can be fabricated using two insulating layers and two metal layers, as explained further in connection with FIG. 13.

With this arrangement, the redistribution layer 44 can be considered to "redistribute" the semiconductor die connections 38 into a configuration designed to mate with the lead frame signal leads 20c-20f in assembly and in this way can be said to "reconstitute" the semiconductor die 34. The particular layout of the solder bumps 48 and the conductive traces 46 can be based on the layout of the lead frame 20. In the embodiment of FIGS. 1-5, the FOWLP 30 relocates the semiconductor die connection pads 38 to different locations where the solder bumps 48 are positioned. As can be seen in FIGS. 1, 4, and 5, the solder bumps 48 are located within the die periphery 34b. In other embodiments, for example as shown in connection with FIGS. 6-10, at least some of the solder bumps of the FOWLP can be positioned outside of the die periphery. Further, it will be appreciated by those of ordinary skill in the art that in still other embodiments, the die connection pads 38 and the solder bumps 48 can be co-located such that there is no relocation of the semiconductor die connection pads and they "pass through" to solder bumps of the FOWLP that are at the same location as the connection pads. In other words, in such an embodiment, there is no redistribution layer.

The insulating layer 50 can be comprised of a suitable electrically insulating material, such as polyimide or BCB (i.e., bisbenzocyclotene). An example thickness of the insulating layer 50 can be on the order of 20 μm.

By extending beyond the periphery, or perimeter 34b of the semiconductor die 34 by at least a distance "d" (FIG. 5), the insulating layer 50 provides the necessary creepage distance (i.e., the necessary distance between two conductive parts along the surface of the insulation material common to the two conductive parts) to suit the application requirements. The creepage requirement is based on the requirement of components to withstand a given working voltage (i.e., the highest voltage level that the insulation can be subjected to when the current sensor is operating in normal use) without breaking down.

The distance "d" beyond which the insulating layer 50 extends from the die perimeter 34b can be referred to as an overhang. It will be appreciated by those of ordinary skill in the art that this distance "d" can be varied to suit the creepage requirements of a particular application. In the current sensor IC 10, the distance "d" can be at least 200 μm for example. Thus, in this example, the minimum distance between the solder bump 48a-48f that are electrically connected to the semiconductor die 34 and the lead frame 20 is 200 μm. The insulating layer 50 need not extend beyond the semiconductor die periphery 34b equally (i.e., by the same distance) in all four directions, since the creepage requirement between the die 34 and the current conductor portion 24 of the lead frame 20 may be different than the creepage requirement between the die 34 and the signal leads 20c-20f due to different working voltage levels of the leads. For example, the distance d' between the top edge of the die 34, the left edge of the die 34, and the right edge of the die 34 (in the view of FIG. 5) and the respectively proximate outer edge of the insulating layer 50 can be 250 μm for example; whereas, the distance d between the bottom edge of the die 34 and the proximate outer edge of the insulating layer 50 can be 200 μm, as illustrated. This is because the current conductor portion 24 of the lead frame 20 can be at higher voltages (and thus, require greater electrical isolation) than the signal leads 20c-20f.

Fabrication of the FOWLP 30 including semiconductor die 34, redistribution layer 44 (FIG. 5), and insulating layer 50 is described in connection with FIG. 13. Suffice it to say here that in providing the insulating layer 50 larger than the die periphery 34b, an encapsulation material 60 can be used to fill the gap provided by the overhang, as can be seen in the views of FIGS. 3 and 5 for example.

Conventionally, FOWLP techniques are used to reconstitute a die that is too small for a particular application into a larger structure that sometimes includes additional connections to suit the application. However, the use of FOWLP 30 in the described current sensor 10 is not for this purpose, as the size of the semiconductor die 34 can be made sufficient for the application (i.e., is dimensioned to be able to mate with the lead frame 20) and can be provided with a sufficient number and locations of connection pads to do so. Use of the FOWLP 30 in the current sensor 10 is for electrical isolation purposes which is achieved by extending the insulating layer 50 of the FOWLP beyond the die periphery 34b. If the insulating layer 50 were not extended beyond the die periphery 34b, breakdown could occur at the edge of the semiconductor die 34.

A further advantage of using the FOWLP 30 in the current sensor IC 10 is that the size of the semiconductor die 34 can be optimized independently of the lead frame 20. In other words, the die 34 need not be designed based on the lead frame 20 that is desired to be used for a particular application. Rather, the die 34 can take a different size and form factor than would otherwise be required by the lead frame 20. Thus, the dimensions of the die 34 can be selected independently of a dimension of the lead frame 20, thereby permitting the lead frame to be re-used (i.e., standardized for use with different die sizes, form factors, and designs), and also permitting the die size to be optimized.

According to a further aspect of the disclosure, an alternative current sensor IC 600 is shown in FIGS. 6-10. Current sensor IC 600 includes a lead frame 620, a fan out wafer level package (FOWLP) 630, and a mold material 640 enclosing the FOWLP and a portion of the lead frame. The lead frame 620 includes at least one (and here four) signal leads 620c-620f. The lead frame 620 can include at least two leads 620a, 620b coupled together to form the current conductor 624.

The FOWLP 630 includes a semiconductor die 634, a redistribution layer 644 (FIG. 10), and an insulating layer 650. The semiconductor die 634 is configured to support at least one magnetic field sensing element 636 (FIG. 10) to sense a magnetic field associated with the current and has a first surface 634a on which at least one connection pad 638 (FIG. 10) is accessible and a second, opposite surface 634c. The connection pad 638, as can be referred to alternatively as a bond pad, is electrically coupled to circuitry supported by the die 634 and is configured to be electrically coupled to the at least one signal lead 620c-620f. The redistribution layer 644 is in contact with the at least one connection pad 638. The insulating layer 650 is in contact with the redistribution layer 644 and extends beyond a periphery, or perimeter 634b of the semiconductor die 634 by at least a minimum distance "d" (FIG. 10).

FOWLP 630 is positioned and dimensioned to provide electrical isolation sufficient to meet a specified creepage requirement of a current sensing application and to do so in a manner that facilitates manufacture of the current sensor IC 600 since the process for FOWLP fabrication is readily available.

Figure 6:
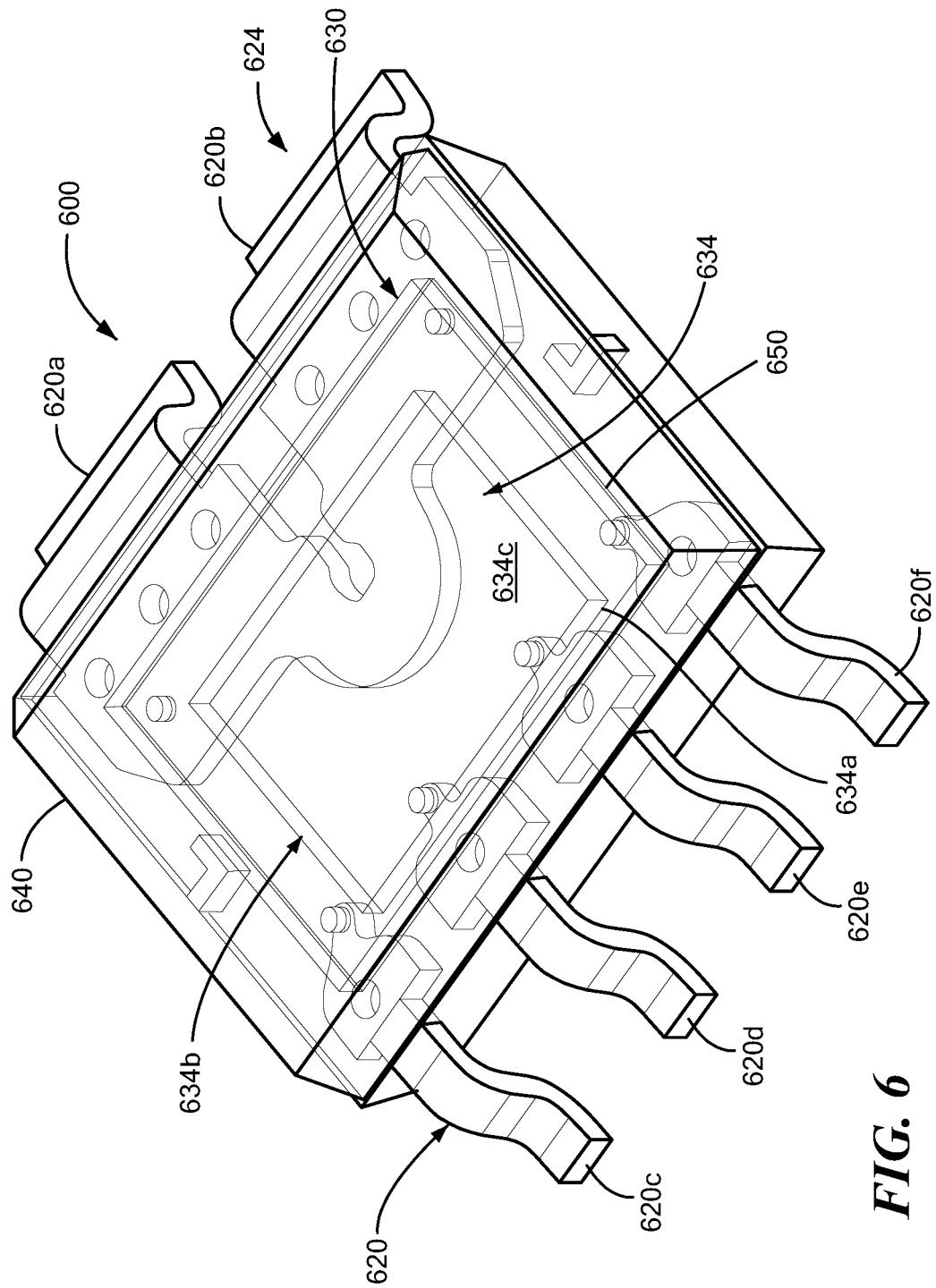
FIG. 6 is an isometric view of a current sensor IC according to a further aspect of the disclosure.
Figure 7:
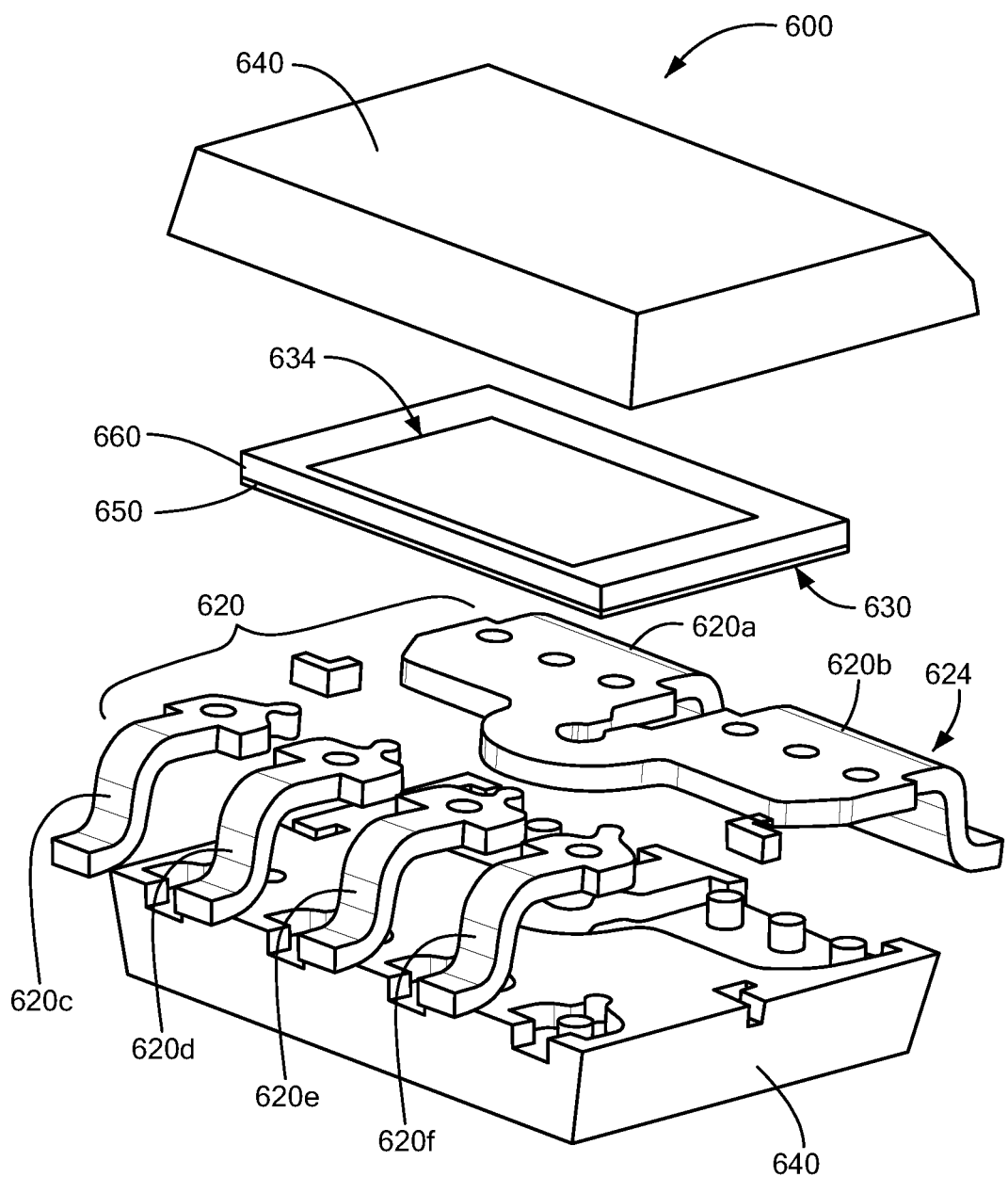
FIG. 7 is an exploded view of the current sensor IC of FIG. 6.
Figure 8:
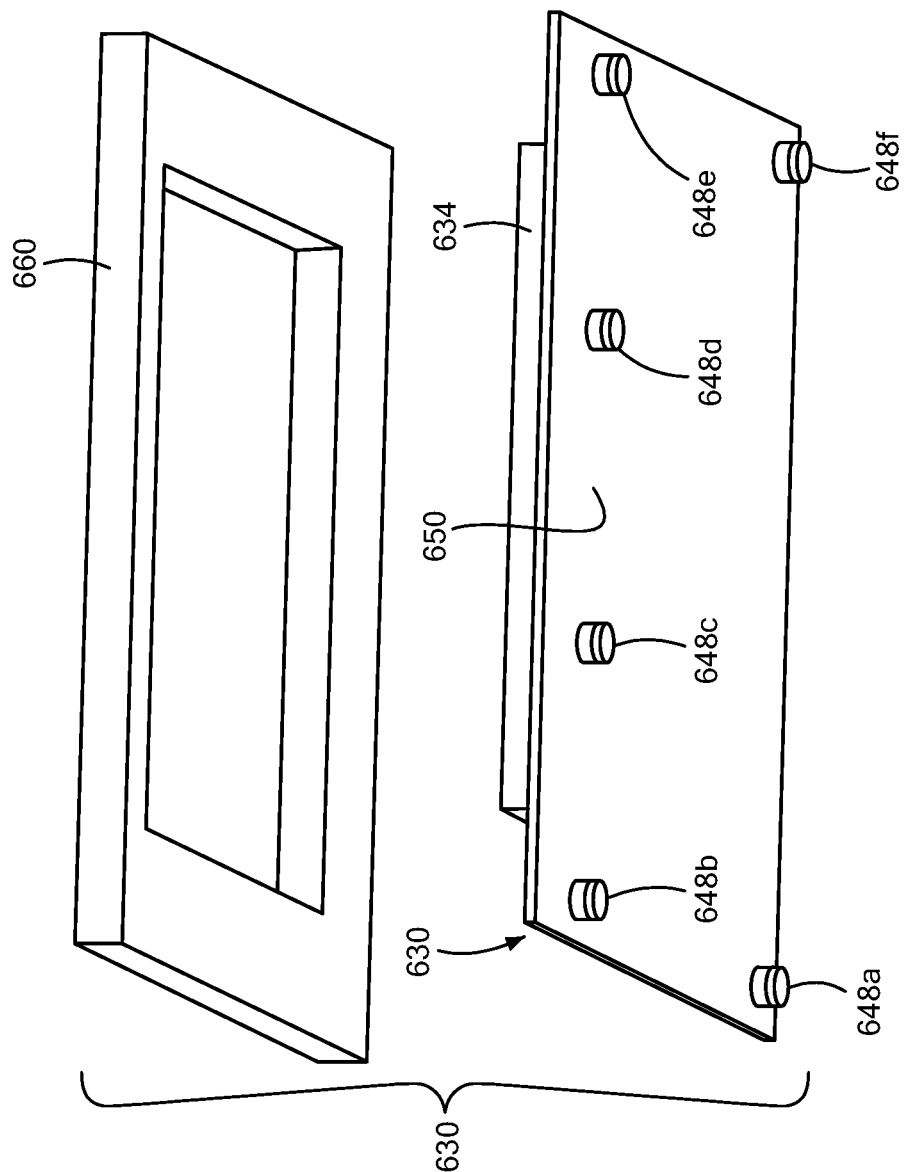
FIG. 8 is an exploded view of a portion of the current sensor IC of FIG. 6.
Figure 9:
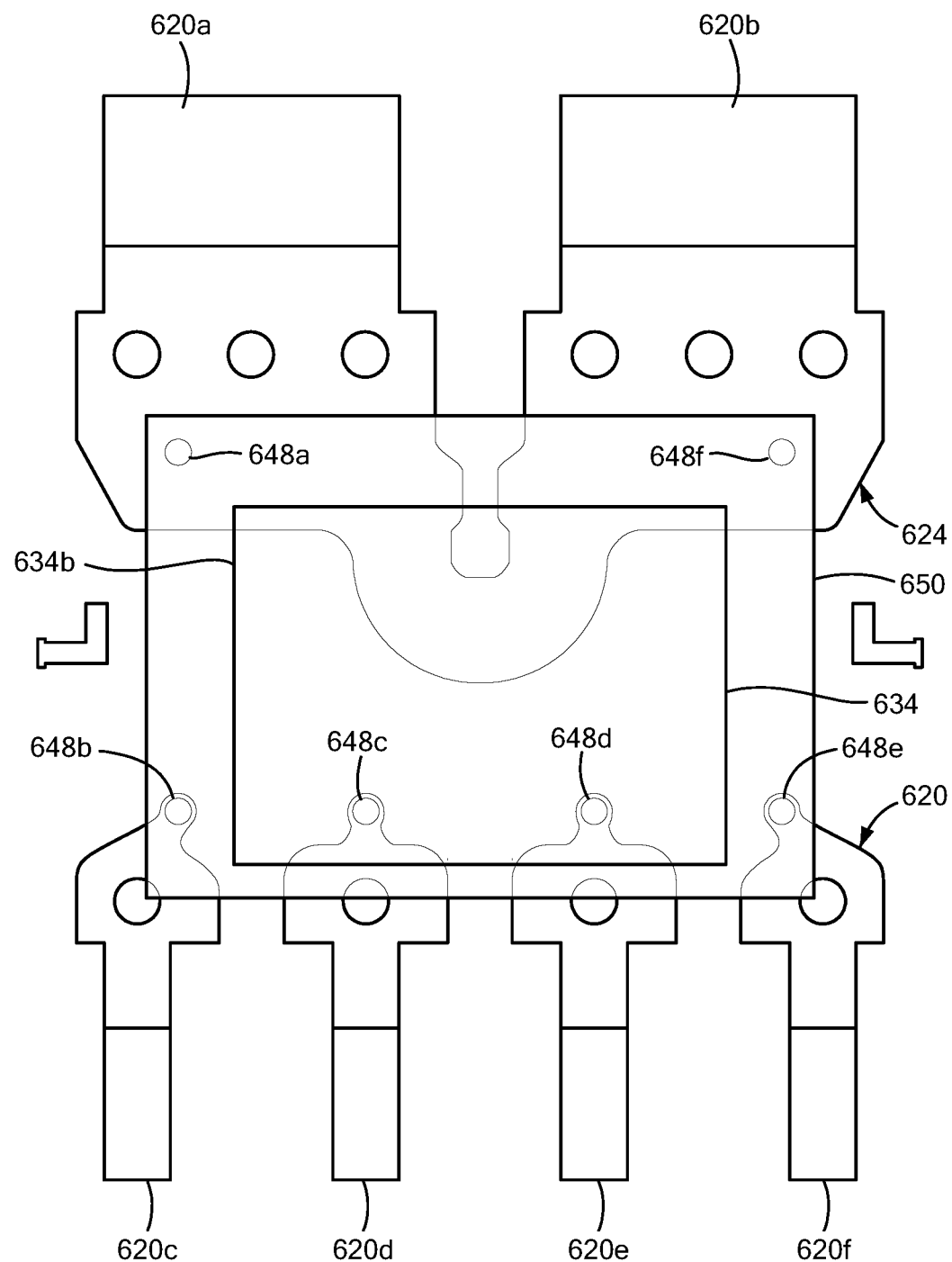
FIG. 9 is a plan view of a portion of the current sensor IC of FIG. 6.
Figure 10:
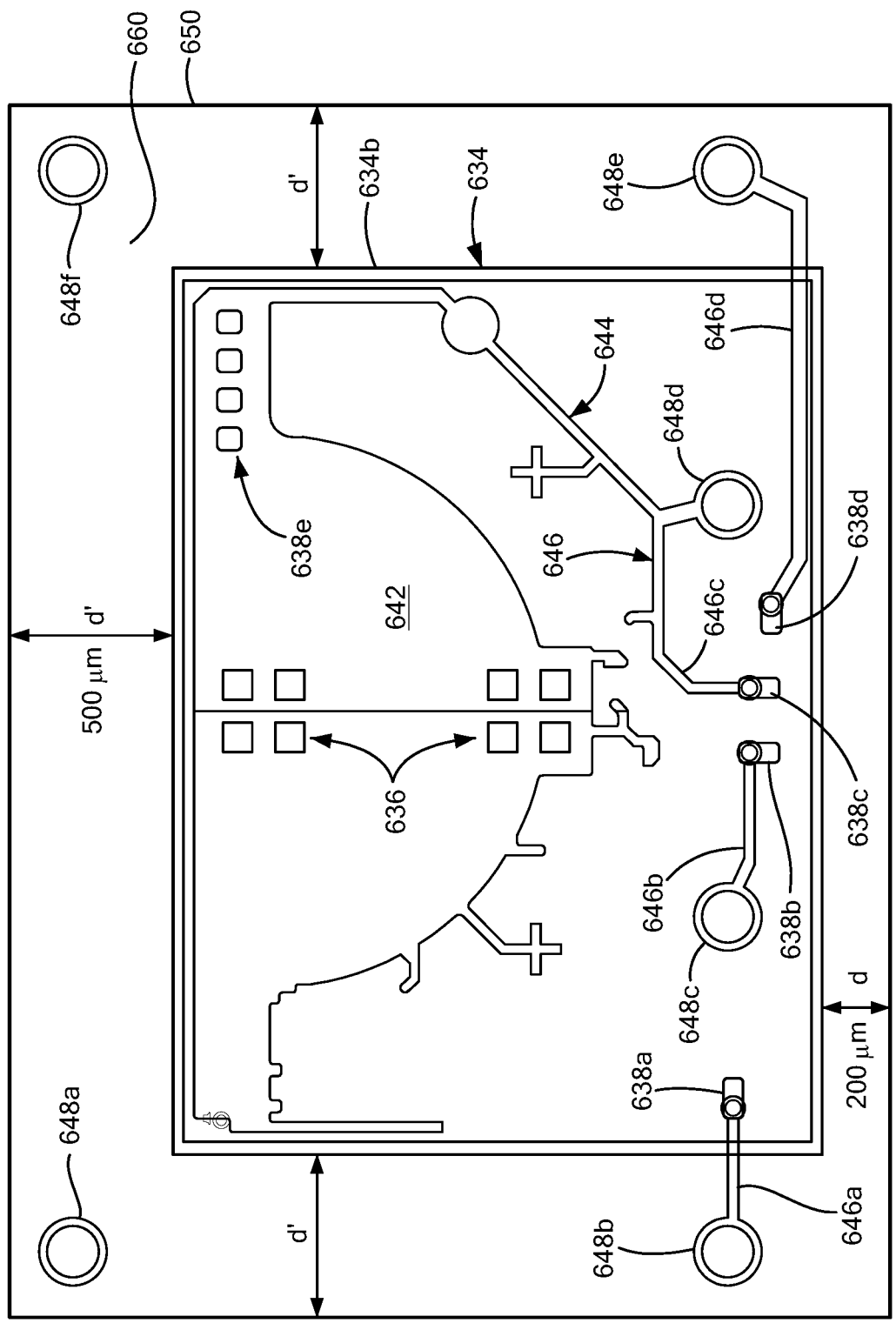
FIG. 10 is a plan view of a portion of the current sensor IC of FIG. 6.

While the current sensor views of FIGS. 6 and 7 include the entire sensor IC 600 (albeit with FIG. 6 shown in exploded fashion), FIGS. 8, 9, and 10 show additional detail of portions of the current sensor. Specifically, FIG. 8 shows an exploded view of the FOWLP 630, FIG. 9 shows a top outline view of the lead frame and FOWLP 630, and FIG. 10 shows a top outline view of the FOWLP 630 and includes details of the semiconductor die 634 and redistribution layer 644.

As can be seen in FIG. 10, the redistribution layer 644 includes one or more conductive traces 646 and one or more solder bumps 648. Here, the redistribution layer 644 includes six solder bumps 648a-648f (herein collectively solder bumps 648) and the semiconductor die 634 includes four connection pads 638a-638d (herein collectively connection pads 638). Connection pads 638a-638d permit electrical connection to be made to magnetic field sensing elements and other elements and circuitry supported by the die 634. As will be explained, die connection pads 638 can be connected to external circuits and systems by being electrically coupled through the FOWLP 630 to lead frame signal leads 620c-620f in a flip-chip configuration.

Example connection pads 638 include pad 638a through which a sensor output signal can be accessed, pad 638b though which a ground connection can be made, pad 638c that provides a power connection to the IC, and pad 638d that provides a connection through which features of the IC 10 can be programmed. Additional connection pads 638e can provide test point access to the die 634.

Conductive traces 646 are configured to electrically couple the semiconductor die connection pads 638 to respective solder bumps 648. For example, a first conductive trace 646a electrically couples connection pad 638a and solder bump 648b, a second conductive trace 646b electrically couples connection pad 638b and solder bump 648c, a third conductive trace 646c electrically couples connection pad 638c and solder bump 648d, and a fourth conductive trace 646d electrically couples connection pad 638d to solder bump 648e. The number of solder bumps 648 and their electrical connection to die connection pads 638 can be based on the desired pinout of the IC package 600.

Figure 13:
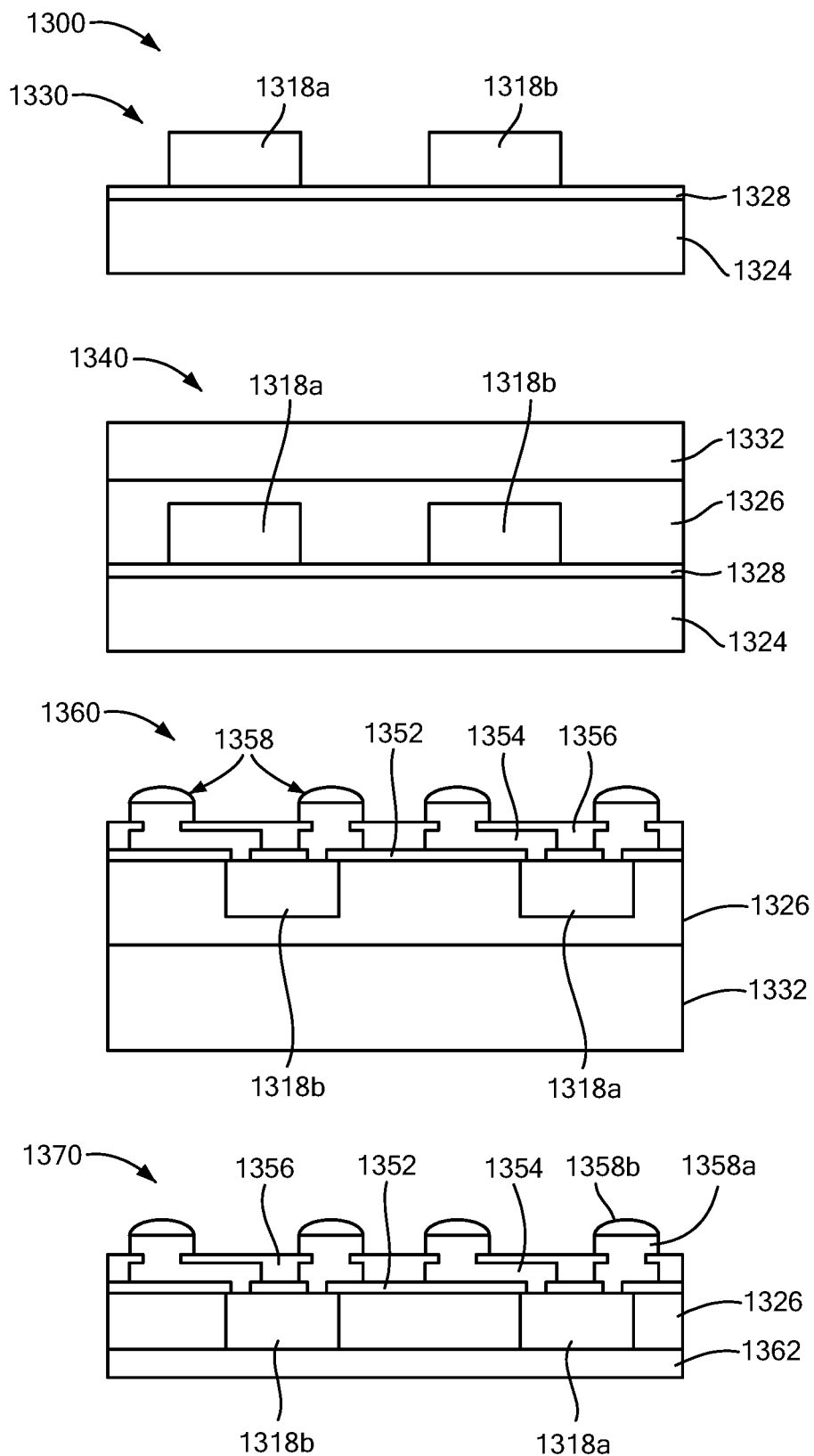
FIG. 13 illustrates an example fabrication process for a FOWLP of a current sensor IC according to the disclosure.

The solder bumps 648 can be fabricated using two insulating layers and two metal layers as explained further in connection with FIG. 13. In assembly, solder bumps 648b, 648c, 648d, 648e are configured to be aligned with signal leads 620c, 620d, 620e, 620f of the lead frame 620 in a flip-chip configuration and soldered to the signal leads in order to achieve an electrical connection between the signal leads and the semiconductor die 634.

The current sensor IC 600 differs from sensor 10 of FIGS. 1-5 in that at least one of the solder bumps 648 (and here two bumps 648a, 648b, 648e, and 648f) are positioned outside of the periphery 634b of the die 634, as shown.

Furthermore, current sensor IC 600 includes an additional feature in that one or more of the solder bumps 648 (and here two such bumps 648a, 648f) are not electrically coupled to the semiconductor die 634 and can be referred to as "dummy bumps." Dummy bumps 648a, 648f are provided for the purpose of mechanical mounting stability by balancing the die 634 when it is attached to the lead frame 620. In particular, in assembly, while solder bumps 648b, 648c, 648d, 648e are soldered to signal leads 620c, 620d, 620e, 620f, respectively, solder bumps 648a, 648f are soldered to leads 620a, 620b of current conductor 624. With this arrangement, of the position of solder bumps 648 distributed substantially evenly around edges of the die 634, the FOWLP 630 sits in a balanced fashion on the lead frame 620.

Implementation of dummy bumps 648a, 648f requires a larger FOWLP 630 than in the embodiment of FIGS. 1-5 since the FOWLP 630 extends to align vertically with the current conductor 624. Further, the dummy bumps 648a, 648f have to be on the order of at least 250 μm away from the die edge 634b.

Redistribution layer 644 can be the same as or similar to redistribution layer 44 (FIGS. 1-5) in terms of material, fabrication, and general form factor for example. The particular layout of the redistribution layer 644 is tailored to couple die connection pads 638 to solder bumps 648. Further, redistribution layer 644 can include a shielding portion 642 configured to reduce the effects of electrical, voltage, or electrical transient noise coupled to active circuitry supported by the semiconductor die 634 and can be coupled to a reference potential, such as ground.

The insulating layer 650 can be the same as or similar to insulating layer 50 (FIGS. 1-5) in terms of material and thickness. Further, as with layer 650, by extending beyond the periphery, or perimeter 634b of the semiconductor die 634 by at least a distance "d" (FIG. 10), the insulating layer 650 provides the necessary creepage distance (i.e., the necessary distance between two conductive parts along the surface of the insulation material common to the two conductive parts) to suit the application requirements. Here again, the creepage requirement is based on the requirement of components to withstand a given working voltage (i.e., the highest voltage level that the insulation can be subjected to when the current sensor is operating in normal use) without breaking down.

The distance "d" beyond which the insulating layer 650 extends from the die perimeter 634b can be referred to as an overhang. In the current sensor IC 600, the distance "d" can be at least 200 μm for example. Thus, in this example, the minimum distance between the semiconductor die 634 and the lead frame 620 is 200 μm. It will be appreciated by those of ordinary skill in the art that this distance "d" can be varied to suit the creepage requirements of a particular application. It will also be appreciated that the insulating layer 650 need not extend beyond the semiconductor die periphery 634*b* equally in all four directions, since the creepage requirement between the die 634 and the current conductor portion 624 of the lead frame 620 may be different than the creepage requirement between the die 634 and the signal leads 620*c*-620*f*. For example, the distance d' between the top edge of the die 634, the left edge of the die 634, and the right edge of the die 634 (in the view of FIG. 10) and the respectively proximate outer edge of the insulating layer 650 can be 500 μm for example; whereas, the distance d between the bottom edge of the die 634 and the proximate outer edge of the insulating layer 650 can be 200 μm. This is because the current conductor portion 624 of the lead frame 620 can be at higher voltages (and thus, require greater electrical isolation) than the signal leads 620*c*-620*f*.

Fabrication of the FOWLP 630 including semiconductor die 634, redistribution layer 644 (FIG. 10), and insulating layer 650 is described in connection with FIG. 13. Suffice it to say here that in forming the insulating layer 650 larger than the die periphery 634*b*, an encapsulation material 660 can be used to fill the gap formed by the overhang, as can be seen in FIGS. 8 and 10 for example.

Figure 11:
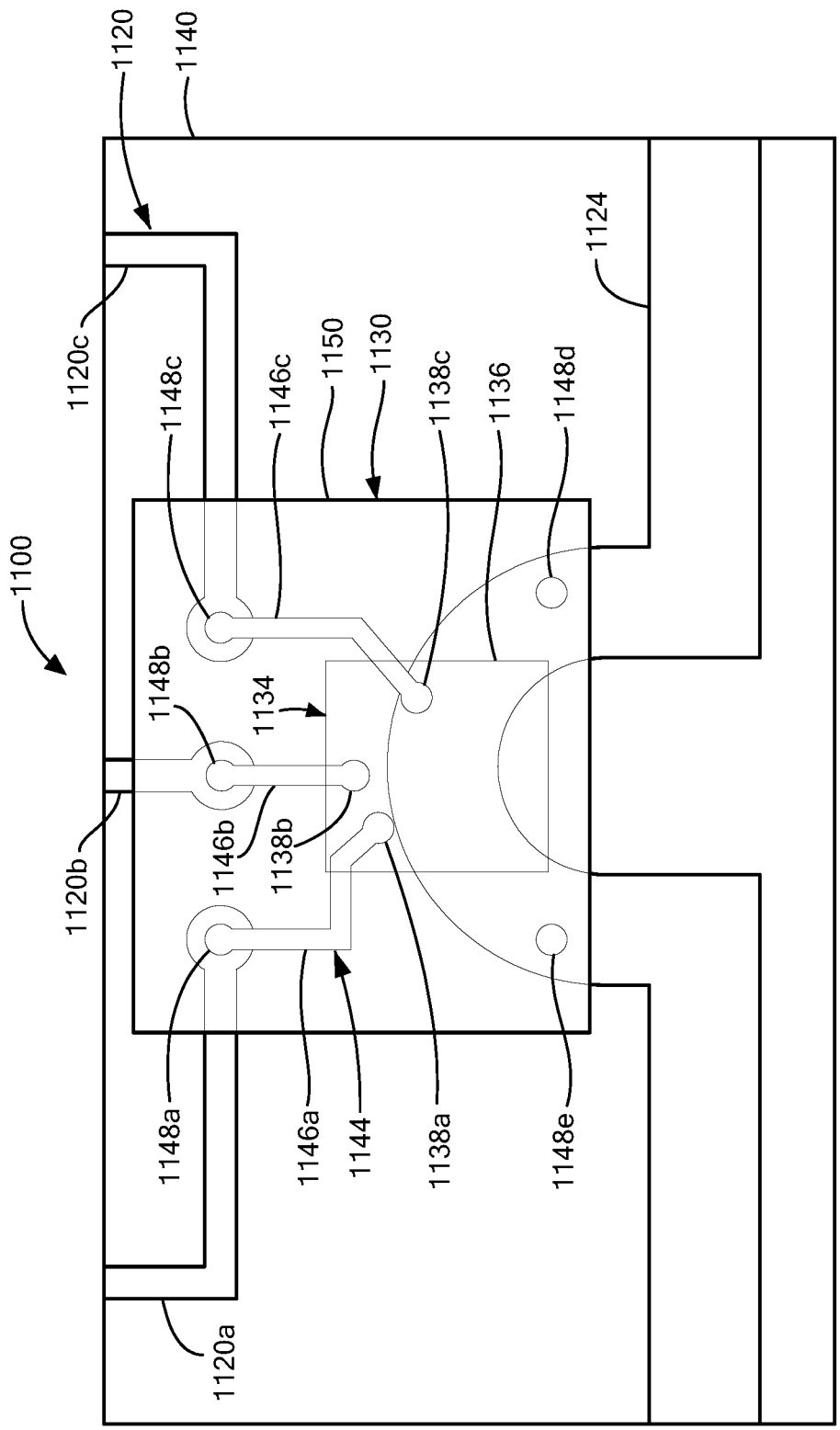
FIG. 11 is a plan view of a current sensor IC according to a further aspect of the disclosure.

Referring to FIG. 11, a current sensor IC 1100 according to a further aspect of the disclosure includes a fan out wafer level package (FOWLP) 1130. A printed circuit board 1140 supports conductive traces 1120 forming signal traces 1120*a*-1120*c* and a current conductor 1124.

The view of FIG. 11 is a simplified view of the current sensor IC 1100. Suffice it to say that the FOWLP 1130 can be the same as or similar to FOWLP 30, 630 as described above. Thus, FOWLP 1130 includes a semiconductor die 1134, a redistribution layer 1144, and an insulating layer 1150. The semiconductor die 1134 is configured to support at least one magnetic field sensing element to sense a magnetic field associated with a current.

The semiconductor die 1134 has a first surface from which at least one connection pad is accessible and a second, opposite surface. It will be appreciated that the first surface and connection pad are not visible in the top view of FIG. 11. The connection pad, or bond pad, is electrically coupled to circuitry supported by the die 1134 and is configured to be electrically coupled to at least one signal trace 1120*a*-1120*c*. The redistribution layer 1144 is in contact with the at least one connection pad and the insulating layer 1150 is in contact with the redistribution layer and extends beyond a periphery, or perimeter 1136 of the semiconductor die by at least a minimum distance, as described above in connection with the embodiments of FIGS. 1-10. Here again, FOWLP 1130 is positioned and dimensioned to provide electrical isolation sufficient to meet a specified creepage requirement of the current sensing application and to do so in a manner that facilitates manufacture of the current sensor IC 1110 since the process for FOWLP fabrication is readily available.

The current sensor IC 1100 differs from sensor 10 of FIGS. 1-5 and sensor 600 of FIGS. 6-10 in that the current conductor 1124 is external with respect to the current sensor IC 1100. In use, the current sensor 1100 is positioned with respect to an external conductor 1124 such that the. The bottom surface of the semiconductor die 1134 is proximate to the conductor 1124. In this flip-chip configuration, magnetic field sensing elements supported by the die 1134 are proximate to the conductor 1124 and can detect a magnetic field generated by current through the conductor.

The illustrated current conductor 1124 is part of a printed circuit board 1140 to which the FOWLP 1130 and semiconductor die 1134 are attached and may take the form of a conductive trace of the printed circuit board.

It will be appreciated by those of ordinary skill in the art however that the current conductor 1124 could alternatively be a bus bar or other type of current conductor structure that is external with respect to the IC 1100. The conductor 1124 can include a horseshoe shape as shown and, in assembly, magnetic field sensing elements supported by the die 1134 can be positioned on either side of the horseshoe. It will also be appreciated by those of ordinary skill in the art that the shape, dimensions, and material of the current conductor 1124 can be varied to suit the particular current sensing application.

As can be seen in FIG. 11, the redistribution layer 1144 includes one or more conductive traces 1146 and one or more solder bumps 1148. Here, the redistribution layer 1144 includes three solder bumps 1148*a*-1148*c* (herein collectively solder bumps 1148) and the semiconductor die 1134 includes three connection pads 1138*a*-1138*c* (herein collectively connection pads 1138). Connection pads 1138*a*-1138*c* permit electrical connection to be made to magnetic field sensing elements and other elements and circuitry supported by the die 1134. Die connection pads 1138 can be connected to external circuits and systems by being electrically coupled through FOWLP 1130 to signal traces 1120*a*-1120*c* in a flip-chip configuration.

Conductive traces 1146 are configured to electrically couple the semiconductor die connection pads 1138 to respective solder bumps 1148. For example, a first conductive trace 1146*a* electrically couples connection pad 1138*a* and solder bump 1148*a*, a second conductive trace 1146*b* electrically couples connection pad 1138*b* and solder bump 1148*b*, and a third conductive trace 1146*c* electrically couples connection pad 1138*c* to solder bump 1148*c*. The number of solder bumps 1148 and their electrical connection to die connection pads 1138 can be based on the desired pinout of the current sensor IC 1100.

The solder bumps 1148 can be fabricated using two insulating layers and two metal layers as explained further in connection with FIG. 13. Similar to current sensor IC 600 described above, the solder bumps 1148*a*-1148*e* are positioned outside of the periphery 1136 of the die 1134, as shown.

In assembly, solder bumps 1148*a*, 1148*b*, 1148*c* are configured to be aligned with signal traces 1120*a*, 1120*b*, 1120*c* in a flip-chip configuration and soldered to the signal traces in order to achieve an electrical connection between the signal traces and the semiconductor die 1134.

Solder bumps 1148*d*, 1148*e* are dummy bumps that are not electrically coupled to the semiconductor die 1134 and that are provided for mechanical mounting stability by balancing the FOWLP 1130 when it is attached to the printed circuit board 1140, with bumps 1148*d*, 1148*e* attached to conductor 1124, such as by soldering.

Figure 12:
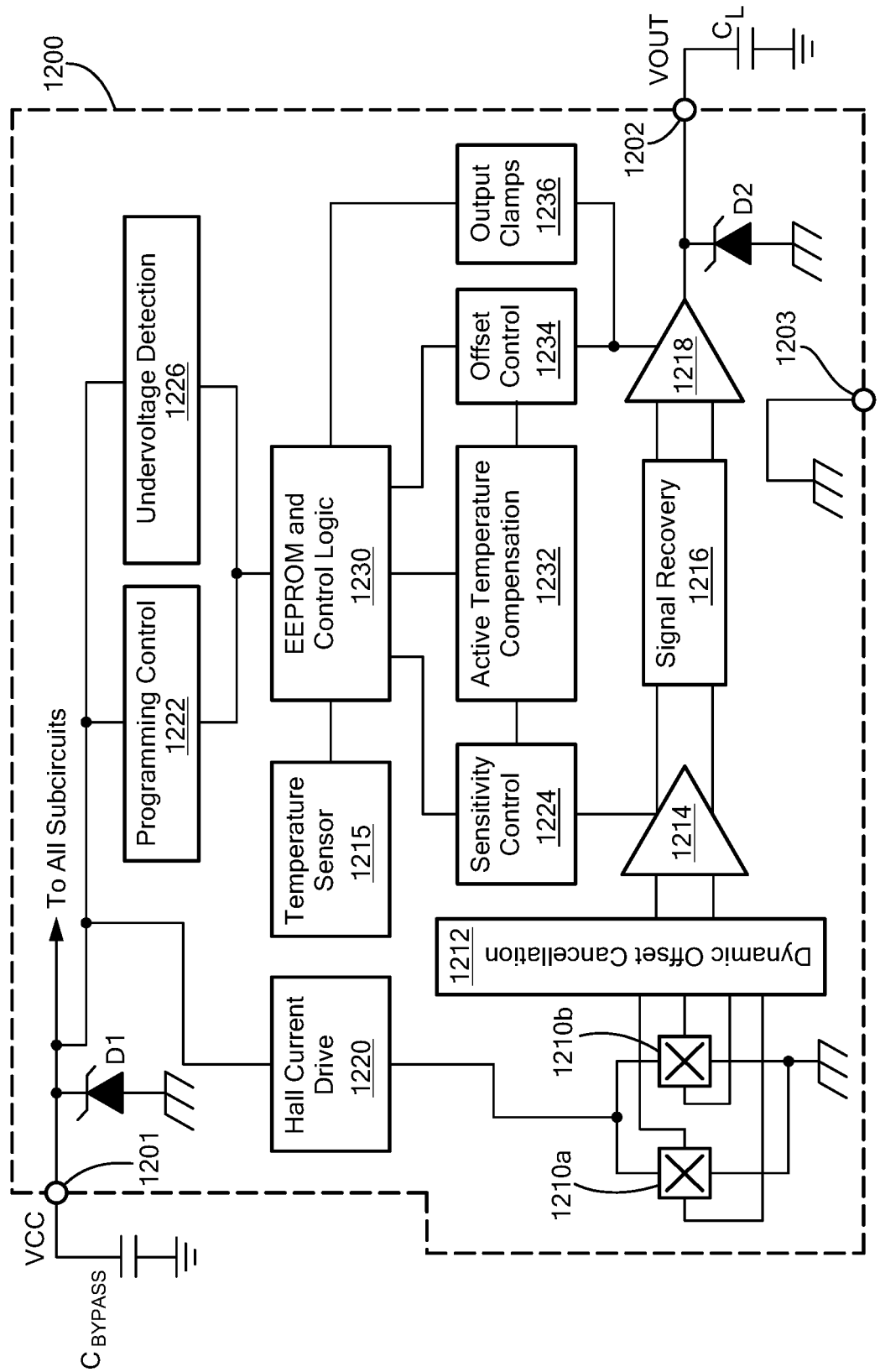
FIG. 12 is a schematic block diagram of an example current sensor IC according to the disclosure.

Referring to FIG. 12, a schematic block diagram of an example current sensor IC 1200 as can represent current sensor 10, 600, and/or 1100 includes one or more magnetic field sensing elements, and here two sensing elements 1210*a*, 11210*b*. Sensing elements 1210*a*, 1210*b* can be Hall effect elements or other magnetic field transducer element types. It will be appreciated that sensor 1200 is presented as a non-limiting example of circuitry suitable for sensors 10, 600, 1100.

Use of two or more sensing elements 1210*a*, 1210*b* permits differential magnetic field sensing, as may be advantageous to improve immunity (i.e., insensitivity) to common-mode stray magnetic fields. The output of the sensor VOUT is proportional to $\Delta B = B_R - B_L$ where $B_R$ represents magnetic field incident on one of the sensing elements (e.g., so-called "right" sensing element 1210b) and $B_L$ represents magnetic field incident on the other one of the sensing elements (e.g., so-called "left" sensing element 1210a). The sensor output VOUT is also affected by the sensitivity, $\alpha$, of the signal path to magnetic field and can be represented as follows:

$$VOUT = \alpha \times \Delta B \quad (1)$$

The relationship between the conductor current to be measured and the differential field $\Delta B$ can be represented by a coupling factor, CF as follows:

$$\Delta B = CF \times I \quad (2)$$

It will be appreciated that coupling factor CF corresponds to coupling between a given current sensor and a proximate conductor (e.g., conductor 24, 624, 1124).

While differential sensing may be implemented, for example using two sensing elements as shown, in some embodiments, the current sensor can include only a single sensing element. Furthermore, it will also be appreciated that differential sensing can be implemented with more than two sensing elements (e.g., as shown in FIGS. 5 and 10) and can include the use of sensing elements arranged in a bridge configuration.

Example current sensor 1200 has three pins in this embodiment, including a VCC (supply voltage) pin 1201, a VOUT (output signal) pin 1002, and a GND (ground) pin 1203. The VCC pin 1201 is used for the input power supply or supply voltage for the current sensor 1200. A bypass capacitor, $C_{BYPASS}$, can be coupled between the VCC pin 1201 and ground. The VCC pin 1201 can also be used for programming the current sensor 1200. The VOUT pin 1202 is used for providing the output signal for the current sensor 1200 to circuits and systems (not shown) and can also be used for programming. An output load capacitance $C_L$ is coupled between the VOUT pin 1202 and ground. The example current sensor 1200 can include a first diode D1 coupled between the VCC pin 1201 and chassis ground and a second diode D2 coupled between the VOUT pin 1202 and chassis ground.

Magnetic field signals generated by the magnetic field sensing elements 1210a, 1210b are coupled to a dynamic offset cancellation circuit 1212, which is further coupled to an amplifier 1214. The amplifier 1214 is configured to generate an amplified signal for coupling to the signal recovery circuit 1216. Dynamic offset cancellation circuit 1212 may take various forms including chopping circuitry and may function in conjunction with offset control 1234 to remove offset that can be associated with the magnetic field sensing elements 1210a, 1210b and/or the amplifier 1214. For example, offset cancellation circuit 1212 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 1200 to regulate the supply voltage.

A programming control circuit 1222 is coupled between the VCC pin 1201 and EEPROM and control logic 1230 to provide appropriate control to the EEPROM and control logic circuit. EEPROM and control logic circuit 1230 determines any application-specific coding and can be erased and reprogrammed using a pulsed voltage. A sensitivity control circuit 1224 can be coupled to the amplifier 1214 to generate and provide a sensitivity control signal to the amplifier 1214 to adjust a sensitivity and/or operating voltage of the amplifier. An active temperature compensation circuit 1232 can be coupled to sensitivity control circuit 1224, EEPROM and control logic circuit 1230, and offset control circuit 1234. The offset control circuit 1234 can generate and provide an offset signal to a push/pull driver circuit 1218 (which may be an amplifier) to adjust the sensitivity and/or operating voltage of the driver circuit. The active temperature compensation circuit 1232 can acquire temperature data from EEPROM and control logic circuit 1230 via a temperature sensor 1215 and perform necessary calculations to compensate for changes in temperature, if needed. Output clamps circuit 1236 can be coupled between the EEPROM and control logic 1230 and the driver 1218 to limit the output voltage and for diagnostic purposes. For example, if the total output range can be from 0V to 5V, for magnetic fields from 0G to 1000G, it may be desired to use a clamp at 0.5V for any field below 100G. For example, it may be known that below 100G, the sensor 1100 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 1226 can operate to detect an undervoltage condition of the supply voltage level VCC. It will be appreciated that while FIG. 12 shows an example current sensor 1200 primarily as a digital implementation, any appropriate current sensor can be used in accordance with the present disclosure, including both digital, analog, and combined digital and analog implementations.

Referring to FIG. 13, fabrication of an example FOWLP 1300 is illustrated, as may be used to form the FOWLP 30 of FIGS. 1-5 and/or the FOWLP 630 of FIGS. 6-10 and/or the FOWLP 1130 of FIG. 11 is shown. Fabrication begins with a semiconductor wafer that can be back grinded and sawed to form a plurality of individual die, two of which are shown for simplicity of illustration 1318a, 1318b.

Die 1318a, 1318b are picked and placed on a carrier 1324 with a temporary bonding film 1328 as shown at step 1330. An encapsulation material 1326 is applied to cover the die 1318a, 1318b, following which a silicon support wafer 1332 is applied over the encapsulation material, as shown at step 1340.

At step 1360, the structure is flipped and the carrier 1324 is removed, as shown.

Redistribution layer 1354 is applied through patterned layer 1352 and solder bumps 1358 are formed. As described above, redistribution layer 1354 can be patterned as suitable in order to electrically couple connection pads of the semiconductor die 1318a, 1318b to respective solder bumps 1358. For example, redistribution layer 1354 can include conductive traces as shown for example in FIGS. 5 and 10.

An insulating layer 1356 (e.g., insulating layer 50 of FIGS. 1-5 or layer 650 of FIGS. 6-10) is applied as shown. As shown in the embodiments above, insulating layer 1356, as may be comprised of polyimide for example, can extend beyond a periphery of the respective die 1318a, 1318b in order to provide the requisite electrical isolation to suit the current sensing application.

Solder bumps 1358 can be formed using two insulating layers (e.g., polyimide) and two metal layers (e.g., tin, copper, nickel), in which case such bumps can take the form of so-called pillar solder bumps that are sometimes described as 2P2M bumps and can include a first, pillar portion 1358a and a second, cap portion 1358b. For example, pillar solder bumps 1358 can include a copper pillar and a SnAg cap. It will be appreciated by those of ordinary skill in the art that solder bumps 1358 can take the form of plated SnAg solder bumps or preformed SnAgCu (SAC) bumps. Alternatively, it will be appreciated by those of ordinary skill in the art that in the embodiment shown in FIGS. 1-5 and in embodiments in which a redistribution layer is not required, the solder bumps can be formed using a single insulating layer and single metal layer as so-called 1P1M bumps.

As shown at 1370, the silicon support wafer 1332 can then be removed and back grinded to desired thickness, and backside lamination layer 1362 can, optionally, be applied. In the case of current sensor embodiments 10, 600, 1100, the backside lamination layer 1362 may be omitted since the resulting structure is encapsulated with mold material 40, 640, 1140, respectively, for example.

The resulting structure is marked at boundaries of the fabricated FOWLP and sawed in order to separate the structure into individual FOWLP, such as the above-described FOWLP 30, 630, 1130.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A current sensor integrated circuit configured to sense a current through a current conductor, comprising:
   a lead frame comprising at least one signal lead;
   a fan out wafer level package (FOWLP) comprising:
   (a) a semiconductor die configured to support at least one magnetic field sensing element to sense a magnetic field associated with the current, wherein the semiconductor die has a first surface from which at least one connection pad is accessible, wherein the at least one connection pad is configured to be electrically coupled to the at least one signal lead;
   (b) a redistribution layer in contact with the at least one connection pad comprising a conductive trace and at least one solder bump, wherein the conductive trace is electrically coupled between the at least one connection pad of the semiconductor die and the at least one solder bump, and wherein the conductive trace extends beyond the periphery of the semiconductor die and wherein the at least one solder bump is positioned beyond the periphery of the semiconductor die; and
   (c) an insulating layer in contact with the redistribution layer, wherein the insulating layer is configured to extend beyond a periphery of the semiconductor die by a minimum distance; and
   a mold material enclosing the FOWLP and a portion of the lead frame.

2. The current sensor integrated circuit of claim 1, wherein the at least one solder bump is configured to be electrically connected to the at least one signal lead of the lead frame in a flip-chip configuration.

3. The current sensor integrated circuit of claim 1, wherein the at least one solder bump of the redistribution layer comprises two insulating layers and two metal layers.

4. The current sensor integrated circuit of claim 1, wherein the minimum distance is based on electrical isolation breakdown requirements.

5. The current sensor integrated circuit of claim 4, wherein the minimum distance is on the order of 200 microns.

6. The current sensor integrated circuit of claim 1, wherein the insulating layer comprises polyimide.

7. The current sensor integrated circuit of claim 1, wherein the at least one solder bump of the redistribution layer comprises at least one first solder bump configured to electrically connect the semiconductor die to the at least one signal lead and at least one second solder bump that is not electrically connected to the semiconductor die and that is configured to be attached to the current conductor.

8. The current sensor integrated circuit of claim 1, wherein a dimension of the semiconductor die is selected independently of a dimension of the lead frame.

9. The current sensor integrated circuit of claim 1, wherein the lead frame further comprises at least two leads coupled together to form the current conductor.

10. The current sensor integrated circuit of claim 1, wherein the current conductor is external with respect to the current sensor integrated circuit.

11. The current sensor integrated circuit of claim 10, wherein the current conductor is part of a printed circuit board.

12. A method of manufacturing a current sensor integrated circuit to sense a current through a current conductor, the method comprising:
   providing a lead frame comprising at least one signal lead;
   providing a fan out wafer level package (FOWLP) comprising a semiconductor die configured to support at least one magnetic field sensing element to sense a magnetic field associated with the current and comprising at least one connection pad configured to be electrically coupled to the at least one signal lead, a redistribution layer in contact with the semiconductor die and comprising at least one solder bump, and an insulating layer in contact with the redistribution layer and extending beyond a periphery of the semiconductor die by a minimum distance, wherein providing the redistribution layer comprises applying a conductive trace to the semiconductor die of the FOWLP between the connection pad and the at least one solder bump and wherein the at least one solder bump is positioned beyond the periphery of the semiconductor die; and
   assembling the current sensor integrated circuit by soldering the at least one solder bump to the at least one signal lead of the lead frame.

13. The method of claim 12, wherein providing the FOWLP comprises:
   (a) Dicing a wafer into a plurality of semiconductor die, each semiconductor die having a first surface from which the at least one connection pad is accessible and a second, opposing surface;

(b) applying the plurality of semiconductor die to a carrier with the second surface of each of the plurality of semiconductor die adjacent to the carrier, wherein the plurality of semiconductor die are spaced apart on the carrier;
(c) encapsulating the plurality of semiconductor die with an encapsulation material in contact with the first surface of each of the plurality of semiconductor die;
(d) applying a support wafer to the encapsulation material;
(e) removing the carrier;
(f) providing the redistribution layer on the first surface of each of the plurality of semiconductor die;
(g) applying the insulating layer on the first surface of each of the plurality of semiconductor die;
(h) removing the support wafer; and
(i) dicing the plurality of semiconductor die to form the FOWLP.

14. The method of claim 13, wherein providing the redistribution layer comprising at least one solder bump comprises applying two insulating layers and two metal layers to form the at least one solder bump.

15. The method of claim 13, wherein applying the insulating layer comprises applying a polyimide layer.

16. The method of claim 13, wherein providing the redistribution layer comprises providing at least one first solder bump configured to electrically connect the semiconductor die to the at least one signal lead and at least one second solder bump that is not electrically connected to the semiconductor die, and wherein assembling the current sensor integrated circuit further comprises soldering the at least one second solder bump to the current conductor.

17. The method of claim 12, wherein providing the lead frame comprises coupling together at least two leads of the lead frame to form the current conductor.

* * * * *

UNITED STATES PATENT AND TRADEMARK OFFICE
CERTIFICATE OF CORRECTION

PATENT NO. : 11,644,485 B2
APPLICATION NO. : 17/495879
DATED : May 9, 2023
INVENTOR(S) : Shixi Louis Liu et al.

It is certified that error appears in the above-identified patent and that said Letters Patent is hereby corrected as shown below:

On the Title Page

Item (57) Abstract, Line 2 delete "frame at" and replace with --frame having at--.

In the Specification

Column 4, Line 58 delete "though" and replace with --through--.

Column 6, Line 13 delete "bump" and replace with --bumps--.

Column 7, Line 54 delete "though" and replace with --through--.

Column 8, Line 13 delete "two" and replace with --four--.

Column 9, Line 55 delete "1110" and replace with --1100--.

Column 9, Line 62 delete "1124 such that the. The" and replace with --1124 such that the--.

Column 10, Line 61 delete ", 11210b." and replace with --, 1210b.--.

Column 11, Line 31 delete "pin 1002," and replace with --pin 1202,--.

Column 12, Line 25 delete "1100" and replace with --1200--.

Signed and Sealed this
Second Day of April, 2024

Katherine Kelly Vidal
*Director of the United States Patent and Trademark Office*